United States Patent
Nukaraju et al.

(10) Patent No.: US 8,514,652 B2
(45) Date of Patent: Aug. 20, 2013

(54) MULTIPLE-PORT MEMORY DEVICE COMPRISING SINGLE-PORT MEMORY DEVICE WITH SUPPORTING CONTROL CIRCUITRY

(75) Inventors: Ravikumar Nukaraju, Bangalore (IN); Ashwin Narasimha, Bangalore (IN)

(73) Assignee: LSI Corporation, San Jose, CA (US)

( * ) Notice: Subject to any disclaimer, the term of this patent is extended or adjusted under 35 U.S.C. 154(b) by 268 days.

(21) Appl. No.: 13/038,662

(22) Filed: Mar. 2, 2011

(65) Prior Publication Data
US 2012/0224435 A1      Sep. 6, 2012

(51) Int. Cl.
*G11C 8/00*  (2006.01)
(52) U.S. Cl.
USPC ................. 365/230.05; 365/230.08
(58) Field of Classification Search
USPC .................................... 365/230.05
See application file for complete search history.

(56) References Cited

U.S. PATENT DOCUMENTS

| | | | |
|---|---|---|---|
| 5,781,480 A | 7/1998 | Nogle et al. | |
| 6,314,047 B1 | 11/2001 | Keay et al. | |
| 6,928,027 B2 | 8/2005 | Li | |
| 7,349,285 B2 * | 3/2008 | Balasubramanian et al. | 365/230.05 |
| 7,643,330 B1 | 1/2010 | Lin et al. | |

* cited by examiner

*Primary Examiner* — Jason Lappas
(74) *Attorney, Agent, or Firm* — Ryan, Mason & Lewis, LLP

(57) ABSTRACT

A multiple-port memory device having at least first and second ports each configured to support read and write operations. The multiple-port memory device further comprises a single-port memory device and control circuitry coupled between the first and second ports and the single-port memory device. The control circuitry is configured to multiplex input signals received over the first and second ports of the multiple-port memory device into respective input time slots of the single port of the single-port memory device, and to demultiplex output time slots of the single port of the single-port memory device into output signals that are supplied over the first and second ports of the multiple-port memory device. In an illustrative embodiment, the single-port memory device operates at a clock rate that is an integer multiple of a clock rate of first and second memory drivers that supply the input signals to and receive the output signals from the respective first and second ports of the multiple-port memory device.

17 Claims, 6 Drawing Sheets

US 8,514,652 B2

MULTIPLE-PORT MEMORY DEVICE COMPRISING SINGLE-PORT MEMORY DEVICE WITH SUPPORTING CONTROL CIRCUITRY

FIELD OF THE INVENTION

The present invention relates generally to semiconductor memory devices, and more particularly to techniques for implementing multiple-port memory devices.

BACKGROUND OF THE INVENTION

A semiconductor memory device typically includes an array of memory cells arranged in rows and columns, with each memory cell configured to store one or more bits of data. The memory cells within a given row of the array are coupled to a common wordline, while the memory cells within a given column of the array are coupled to a common bitline. Thus, the array includes a memory cell at each point where a wordline intersects with a bitline. Reading a given memory cell generally comprises transferring data stored within that cell to its corresponding bitline, and writing a given memory cell generally comprises transferring data into that cell from its corresponding bitline. Such read and write operations to the given memory cell occur in conjunction with an assertion of its corresponding wordline.

Memory devices of the type described above may each include one or more memory ports. For example, a single-port random access memory (SPRAM) includes a single memory port and only a single read or write access can be done at a given time through this port. A dual-port random access memory (DPRAM) has two independent memory ports, such that read or write accesses can be performed simultaneously and independently through each port.

A conventional SPRAM may be a static memory device formed using six-transistor (6T) static RAM (SRAM) memory cells. A given such SRAM memory cell may include, for example, two NMOS pass gate transistors and a pair of cross-coupled inverters, with the two inverters collectively comprising two PMOS pull-up transistors and two NMOS pull-down transistors. One known approach to implementing a DPRAM involves utilizing a more complex eight-transistor (8T) SRAM memory cell in place of the 6T memory cell used in the SPRAM. However, since the number of memory cells in the array is typically very large, use of the more complex 8T memory cell has a significant negative impact on the overall circuit area and power requirements of the resulting DPRAM device.

It is therefore apparent that a need exists for an improved approach to implementing DPRAMs and other multiple-port memory devices.

SUMMARY OF THE INVENTION

A given illustrative embodiment of the present invention overcomes one or more of the drawbacks of the conventional approaches described above at least in part by providing a multiple-port memory device which is implemented using a single-port memory device in combination with control circuitry. By way of example, a dual-port memory device may be provided that is functionally equivalent to an otherwise conventional DPRAM implemented using 8T memory cells, but instead comprises an SPRAM implemented using 6T memory cells and the above-noted control circuitry. The control circuitry in such an arrangement is advantageously configured to provide the desired DPRAM functionality using the SPRAM and its typical array of 6T memory cells. Thus, the overall circuit area and power requirements of the resulting DPRAM are considerably reduced relative to the conventional 8T memory cell approach.

In one aspect, a multiple-port memory device has at least first and second ports each configured to support read and write operations. The multiple-port memory device further comprises a single-port memory device and control circuitry coupled between the first and second ports and the single-port memory device. The control circuitry is configured to multiplex input signals received over the first and second ports of the multiple-port memory device into respective input time slots of the single port of the single-port memory device, and to demultiplex output time slots of the single port of the single-port memory device into output signals that are supplied over the first and second ports of the multiple-port memory device.

In another aspect, the single-port memory device operates at a clock rate that is an integer multiple of a clock rate of first and second memory drivers that supply the input signals to and receive the output signals from the respective first and second ports of the multiple-port memory device. For example, the multiple-port memory device may comprise a dual-port memory device and the single-port memory device may operate at a clock rate that is twice the clock rate of the first and second memory drivers.

Advantageously, the illustrative embodiments provide a DPRAM or other type of multiple-port memory device that can be implemented with lower complexity and reduced cost relative to conventional arrangements.

A multiple-port memory device in accordance with the invention may be implemented, for example, as a stand-alone memory device, such as a packaged integrated circuit, or as an embedded memory in a microprocessor or other processing device.

DETAILED DESCRIPTION OF THE INVENTION

The invention will be illustrated herein in conjunction with an exemplary dual-port semiconductor memory device formed from a single-port memory device and supporting control circuitry. It should be understood, however, that the invention is more generally applicable to any semiconductor memory device in which a simplified multiple-port configuration is desired, and may be implemented using circuitry other than that specifically shown and described in conjunction with the illustrative embodiments.

Figure 1:
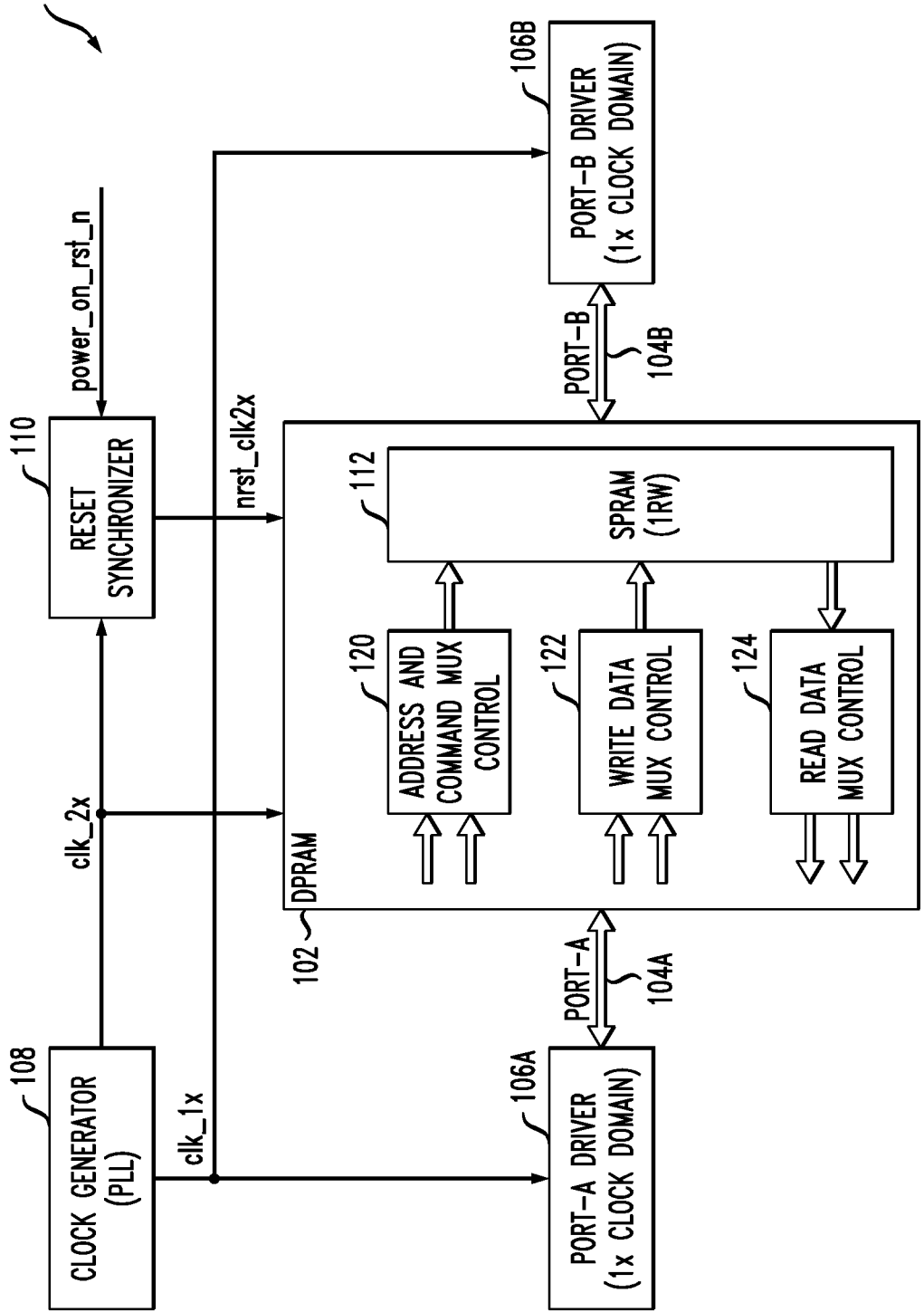
FIG. 1 is a block diagram showing a dual-port memory device formed using a single-port memory device and supporting control circuitry in an illustrative embodiment of the invention.

FIG. 1 shows a semiconductor memory device 100 in accordance with an illustrative embodiment of the invention. The memory device 100 in this embodiment comprises a dual-port random access memory (DPRAM) 102 that has two memory access ports which are denoted Port-A and Port-B, and are also identified as ports 104A and 104B, respectively. The memory device 100 further comprises memory drivers 106A and 106B, a clock generator 108, and a reset synchronizer 110.

The memory drivers 106A and 106B supply signals to and receive signals from the respective memory access ports 104A and 104B of the DPRAM 102.

The clock generator 108, which is illustratively implemented using a phase-locked loop (PLL), generates a first clock signal clk_1x which operates at a designated clock rate and a second clock signal clk_2X which operates at twice the rate of the first clock signal. The first clock signal clk_1x is applied to respective clock inputs of the drivers 106A and 106B, which operate in the clk_1x clock domain, also referred to as the 1× clock domain. The second clock signal clk_2x is applied to clock inputs of the DPRAM 102 and the reset synchronizer 110.

The reset synchronizer 110 also receives a power-on reset signal power_on_rst_n, and generates a reset signal nrst_clk2x for application to the DPRAM 102. The reset signal nrst_clk2x is an active low reset that may be generated, for example, by synchronizing the power-on reset signal to the clk_2x clock domain.

The DPRAM 102 comprises a single-port random access memory (SPRAM) 112 having one read-write (1RW) port, as well as supporting control circuitry that in this embodiment comprises address and command multiplexer (MUX) control circuitry 120, write data MUX control circuitry 122, and read data MUX control circuitry 124. The supporting control circuitry 120, 122 and 124 is also collectively referred to herein as a "wrapper." The logic and other circuit elements of the wrapper are preferably arranged physically close to their corresponding pins of the SPRAM 112 in order to minimize propagation delays.

As indicated previously, the two memory ports Port-A and Port-B of the DPRAM 102 in the present embodiment are driven by respective memory drivers 106A and 106B operating at the clk_1x clock rate. The wrapper does not need the clk_1x clock signal and instead it takes as its clock input the clk_2X clock signal. The clk_2X clock signal is synchronous to the clk_1x signal but runs at double the clock rate. The three control circuitry blocks 120, 122 and 124 provide an interface between the two DPRAM ports and the single port of the SPRAM 112. The functionality and DPRAM port configuration of this implementation may be substantially equivalent to that of an otherwise conventional DPRAM, but with the addition of inputs for the clk_2X clock signal and the active low synchronous reset signal nrst_clk2x. In other implementations, as indicated below, the reset signal need not be utilized by the DPRAM.

The SPRAM 112 comprises a memory array having a plurality of memory cells arranged in rows and columns. Each memory cell is configured to store one or more bits of data. For example, the memory cells may each be configured to store a single bit of data, and such memory cells are also referred to as bit-cells. The rows of the memory array are associated with respective wordlines, and the columns of the memory array are associated with respective bitlines. Each memory cell in a given row is coupled to the common wordline for that row and each memory cell in a given column is coupled to the common bitline for that column. The memory array therefore includes a memory cell at each point where a wordline intersects with a bitline. The memory cells of the memory array may be illustratively arranged in $2^N$ columns and $2^M$ rows, with the values selected for N and M in a given implementation depending upon on the data storage requirements of the application in which the memory device is utilized.

Particular ones of the memory cells of the memory array of SPRAM 112 can be activated for writing data thereto or reading data therefrom by application of appropriate row and column addresses to respective row decoder and column decoder elements, not explicitly shown in the figure. Other elements of SPRAM 112 that may be present in a typical implementation but are not explicitly shown include sense amplifiers and input and output data buffers. The operation of these and other conventional memory device elements is well understood in the art and will not be described in detail herein. The term "memory array" as used herein is intended to be broadly construed, and may encompass one or more associated elements such as the above-noted row and column decoders, sense amplifiers and input and output data buffers.

Each of the memory ports 104A and 104B of DPRAM 102 is able to support one read operation or one write operation at a time, independently of the other port, to any location in the memory array of the SPRAM 112. This is in contrast to the SPRAM 112 itself, which as previously noted includes only a single memory port through which only a single read or write operation can be performed at a time.

It should be noted that the memory device 100 in one or more of the illustrative embodiments is assumed to comprise a static RAM (SRAM) device. Thus, by way of example, the memory cells of the memory array within SPRAM 112 may comprise conventional 6T SRAM memory cells of the type previously described herein. However, as indicated above, the disclosed techniques can be adapted in a straightforward manner for use with other types of memory devices, including, for example, dynamic random access memory (DRAM), electrically erasable programmable ROM (EEPROM), magnetic RAM (MRAM), ferroelectric RAM (FRAM), phase-change RAM (PC-RAM), etc. Also, other types of memory cell configurations may be used. For example, the memory cells in the memory array could be multi-level cells each configured to store more than one bit of data. The invention is thus not limited in terms of the particular storage or access mechanism utilized in the memory array of the single-port memory device.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. Those skilled in the art will recognize that a wide variety of other memory device configurations may be used in implementing the invention.

The present embodiment of memory device 100 is configured to implement DPRAM 102 using SPRAM 112 and the supporting control circuitry comprising MUX control circuitry elements 120, 122 and 124. Advantageously, this embodiment achieves reduced power and circuit area, as well as improved performance, relative to conventional DPRAM arrangements, such as an arrangement involving use of 8T memory cells.

Figure 2:
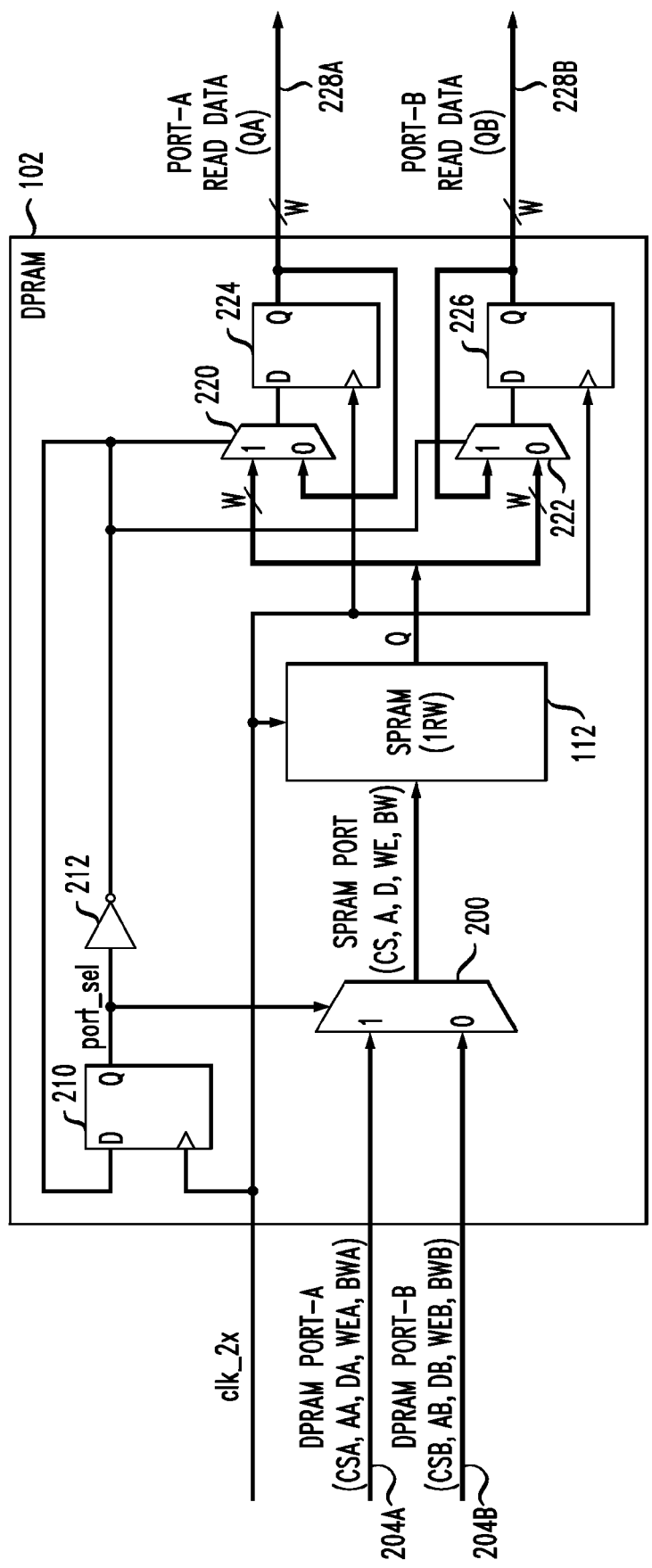
FIG. 2 is a schematic diagram showing one possible implementation of the supporting control circuitry in the dual-port memory device of FIG. 1.

FIG. 2 illustrates one possible implementation of the control circuitry 120, 122 and 124 of the DPRAM 102 in greater detail. In this embodiment, the control circuitry collectively comprises an input multiplexer 200 having a first input coupled to Port-A input 204A and a second input coupled to Port-B input 204B, port select circuitry comprising flip-flop 210 and inverter 212, as well as output multiplexers 220 and 222 and flip-flops 224 and 226 associated with respective Port-A and Port-B read data outputs 228A and 228B. The flip-flops 224 and 226 are examples of what are more generally referred to herein as "latch circuits." Input multiplexer 200 operating in conjunction with port select circuitry 210 and 212 implements address and command MUX control circuitry 120 and write data MUX control circuitry 122, while output multiplexers 220 and 222 and flip-flops 224 and 226 operating in conjunction with port select circuitry 210 and 212 implement the read data MUX control circuitry 124. The port select circuitry 210 and 212 may thus be viewed as a shared portion of the control circuitry 120, 122 and 124.

The Port-A and Port-B inputs 204A and 204B more specifically comprise chip select inputs CSA and CSB, address inputs AA and AB, data inputs DA and DB, write enable inputs WEA and WEB, and maskable write enable inputs BWA and BWB, respectively.

The CSA and CSB chip select inputs serve as memory enable inputs for Port-A and Port-B, respectively. When a given such memory enable input is at a logic high level, the memory is enabled and read or write operations can be performed, and when the memory enable input is at a logic low level, the memory is deactivated.

The address inputs AA and AB are used to provide the address of the particular memory location to be written during a write cycle or read during a read cycle.

The data inputs DA and DB each have a width of W bits and provide the data to be written into the memory location specified by the address input port during the write cycle.

The write enable inputs WEA and WEB are used to control the write and read cycles of the memory. In this embodiment, when a given such write enable input is at a logic high level, the memory is in the write cycle, and when the write enable input is at a logic low level, the memory is in the read cycle.

The maskable write enable inputs BWA and BWB are used to support a bit-write mask feature of the memory which allows selective writing to particular bits of a memory word during a write cycle.

The Port-A and Port-B outputs 228A and 228B more specifically comprise W-bit wide read data outputs denoted QA and QB, respectively. These outputs provide the contents of the memory location addressed by the corresponding address inputs. The variable W denotes the word length in the memory array of SPRAM 112.

The clock inputs of flip-flops 210, 224 and 226 are driven in this embodiment by the clock signal clk_2x. It should be noted that the active low reset signal nrst_clk2x can be used to initialize the port select circuitry flip-flop 210 to a particular value and thus fix the order of Port-A and Port-B access to the SPRAM 112. However, in the particular implementation shown in FIG. 2, this reset is not used. Thus, if the order of Port-A and Port-B access to the SPRAM is not required to be fixed, then the flip-flop 210 need not be initialized. The access order in this case will vary depending upon the flip-flop reset value.

As mentioned previously, the SPRAM 112 is configured to operate at the clk_2X clock rate. The SPRAM includes a single memory port having chip select input CS, address input A, data input D, write enable input WE, maskable write enable input BW, and data output Q. The two DPRAM ports Port-A and Port-B are logically multiplexed at the clk_2X clock rate and their respective write or read commands are issued to the SPRAM. In this embodiment, the functionality does not depend on the order of multiplexing and so the write or read commands can be completed in any order. The write or read commands for Port-A and Port-B arrive at the clk_1x clock rate and are completed in the SPRAM before the next set of commands arrives on the next cycle of the clk_1x clock. The multiplexers 200, 220 and 222 are controlled by the port select circuitry in which flip-flop 210 is utilized to divide the clk_2X clock by a factor of two. The read data output from the SPRAM is latched in flip-flops 224 and 226 using the clk_2X clock and delivered to data outputs 228A and 228B on cycles of the clk_1x clock.

The operation of the DPRAM 102 will now be described in greater detail with reference initially to TABLES 1 through 4 and then to the timing diagrams of FIGS. 3, 4 and 5.

TABLES 1 and 2 below are logic truth tables illustrating for the respective DPRAM ports Port-A and Port-B the relationship between clk_2x, CSA/CSB, WEA/WEB, BWA/BWB, DA/DB and QA/QB for each of idle, disabled, read, write and bit-write mask functions. TABLES 3 and 4 illustrate outputs QA and QB and associated memory state for various dual port contention scenarios, including ones in which the Port-A address is the same as or "equal to" the Port-B address, as shown in TABLE 3, and ones in which the Port-A address is not equal to the Port-B address, as shown in TABLE 4. The tables utilize the following notation:

L→Logic Low

H→Logic High

X→Don't care

↑→Positive edge of clock

Read→Read command on that port

Write→Write command on that port

Mem[a]→Memory location pointed to by Port-A address

Mem[b]→Memory location pointed to by Port-B address

Invalid→The data is invalid and can't be used by memory port driver

Unknown→The data is unknown

TABLE 1

Logic Truth Table for Port-A

| Function | Clk_2x | CSA | WEA | BWA | DA | QA |
|---|---|---|---|---|---|---|
| Idle | L | X | X | X | X | Invalid |
| Disabled | ↑ | L | X | X | X | Invalid |
| Read | ↑ | H | L | X | X | Q |
| Write | ↑ | H | H | H | Data-in | Invalid |
| Mask | ↑ | H | H | L | X | Invalid |

TABLE 2

Logic Truth Table for Port-B

| Function | Clk_2x | CSB | WEB | BWB | DB | QB |
|---|---|---|---|---|---|---|
| Idle | L | X | X | X | X | Invalid |
| Disabled | ↑ | L | X | X | X | Invalid |
| Read | ↑ | H | L | X | X | Q |
| Write | ↑ | H | H | H | Data-in | Invalid |
| Mask | ↑ | H | H | L | X | Invalid |

TABLE 3

Dual Port Contention (Port-A address not equal to Port-B address)

| Port A | Port B | QA | QB | Memory State |
|---|---|---|---|---|
| Read | Read | Mem[AA] | Mem[AB] | No Change |
| Write | Read | Invalid | Mem[AB] | Mem[AA] <= DA |
| Read | Write | Mem[AA] | Invalid | Mem[AB] <= DB |
| Write | Write | Invalid | Invalid | Mem[AA] <= DA |
|  |  |  |  | Mem[AB] <= DB |

TABLE 4

Dual Port Contention (Port-A address equal to Port-B address)

| Port A | Port B | QA | QB | Memory State |
|---|---|---|---|---|
| Read | Read | Mem[A] | Mem[A] | No Change |
| Write | Read | Unknown | Unknown | Mem[A] <= DA |
| Read | Write | Unknown | Unknown | Mem[A] <= DB |
| Write | Write | Unknown | Unknown | Mem[A] <= Unknown |

The DPRAM 102 in the illustrative embodiment described above runs at double the clock rate of a conventional DPRAM. Accordingly, the architecture is limited by the highest clock rate supported by the SPRAM 112 in a given process technology. In general, SPRAMs can run at higher clock rates than corresponding conventional DPRAMs. An additional clock tree and other clock generation circuitry may be required in the memory device 100 in order to generate the clk_2X clock signal, which should be balanced with respect to the clk_1x clock signal. Critical timing paths in the present embodiment may include the timing paths from clk_1x to clk_2X at the input side and from clk_2X to clk_1x at the output side.

Figure 3:
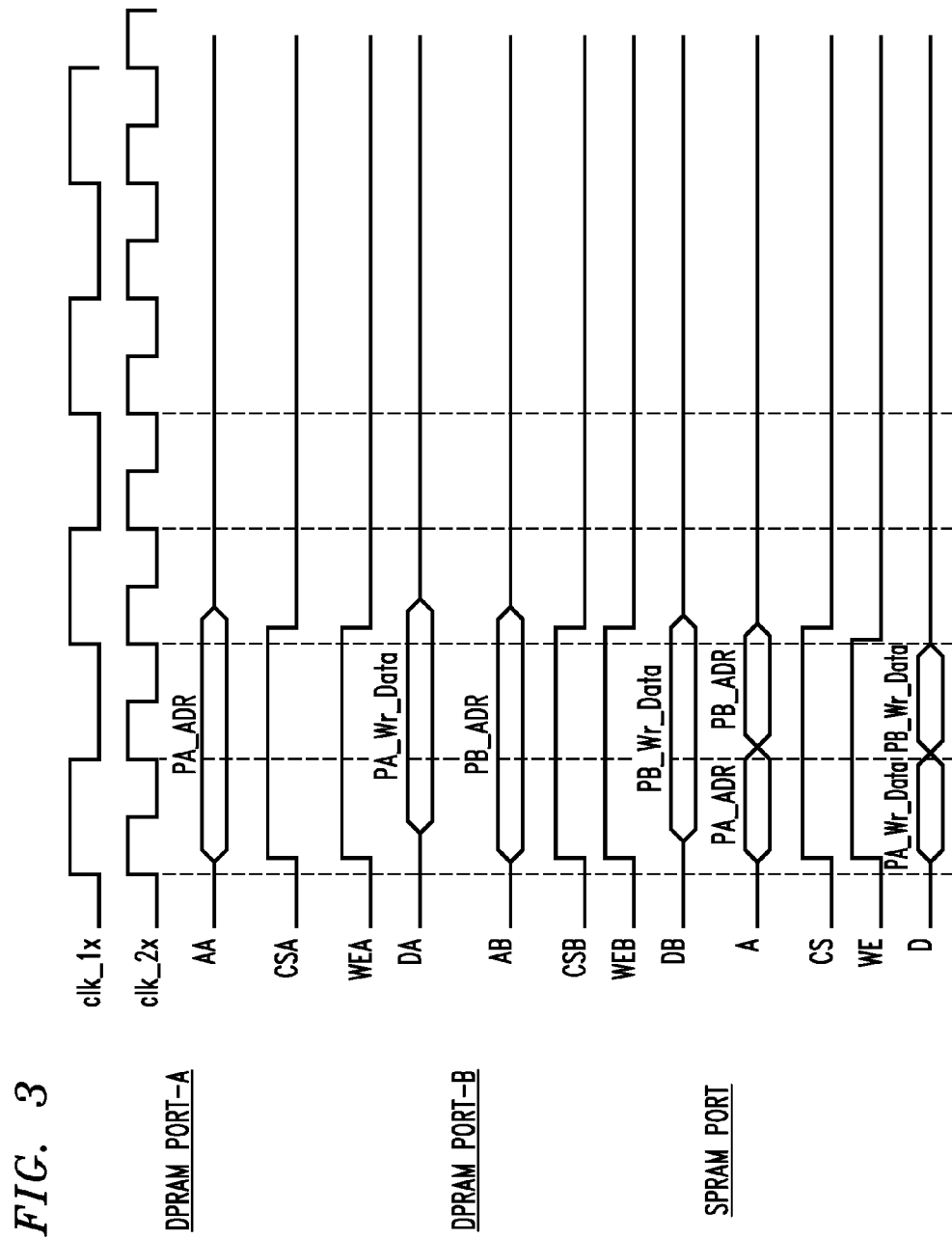
FIG. 3 is a timing diagram illustrating write operations on both ports of the dual-port memory device of FIG. 1.

Referring now to the timing diagram of FIG. 3, the two clock signals clk_1x and clk_2X are shown at the top of the diagram. This diagram also illustrates Port-A and Port-B signals as well as SPRAM port signals for the case of write operations on both ports of the DPRAM 102. The Port-A signals correspond to the respective Port-A inputs AA, CSA, WEA and DA as previously described. The Port-B signals correspond to the respective Port-B inputs AB, CSB, WEB and DB as previously described. The SPRAM port signals correspond to respective address, chip select or memory enable, write enable, and write data inputs of SPRAM 112, denoted A, CS, WE and D, respectively.

It can be seen from the diagram that the write operations for Port-A and Port-B occur substantially simultaneously over the course of one cycle of the clk_1x clock, and further that the corresponding address and write data for Port-A and Port-B are multiplexed by multiplexer 200 into respective time slots of the A and D inputs of the SPRAM. Each such time slot in this embodiment corresponds generally to one cycle of the clk_2X clock signal, although other types of time slots may be used in other embodiments, and that term is therefore intended to be broadly construed herein. The Port-A address and write data are also denoted in the diagram as PA_ADR and PA_Wr_Data, respectively. Similarly, the Port-B address and write data are also denoted in the diagram as PB_ADR and PB_Wr_Data, respectively.

Figure 4:
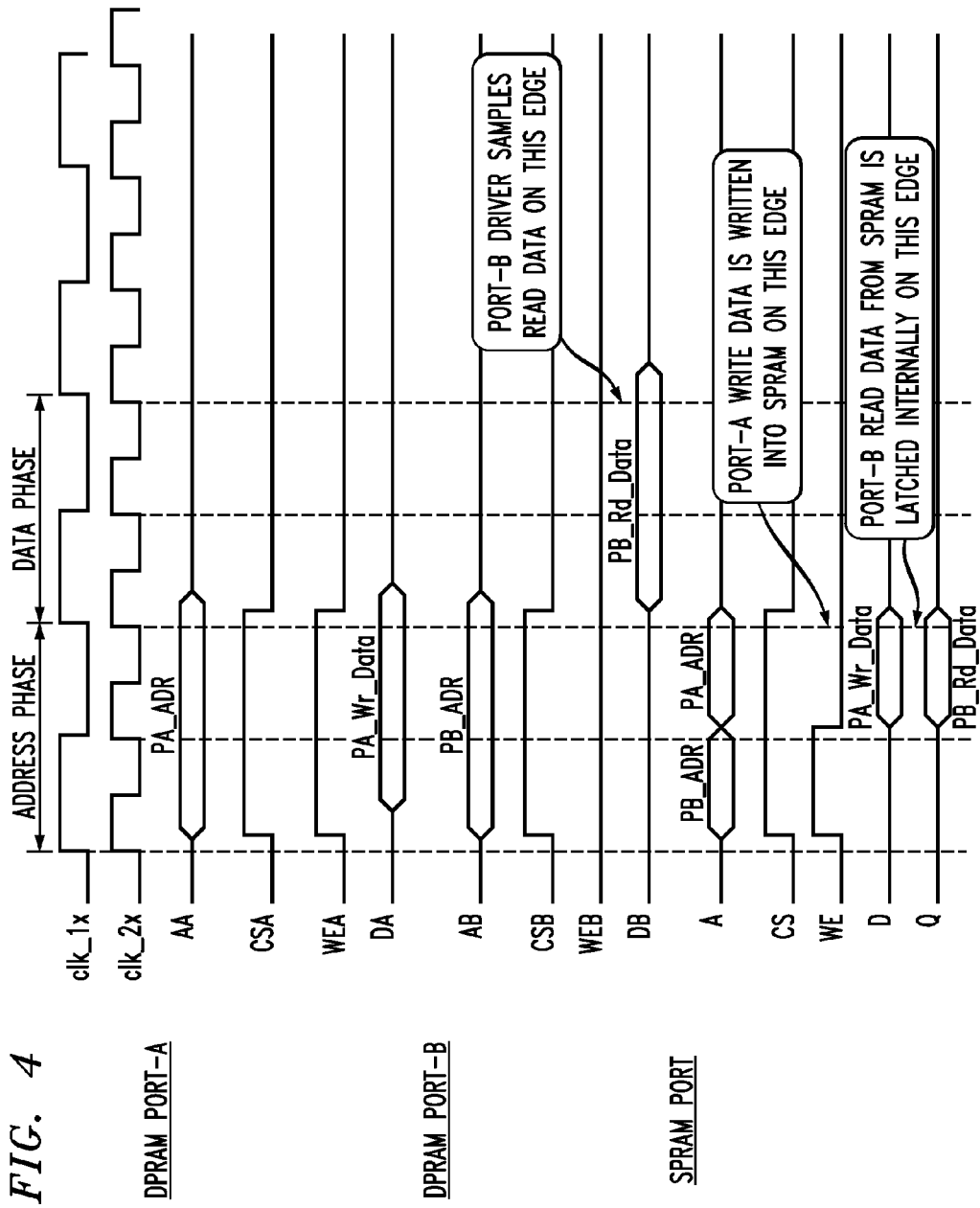
FIG. 4 is a timing diagram illustrating a write operation on one port and a read operation on the other port of the dual-port memory device of FIG. 1.

The FIG. 4 timing diagram illustrates the case of a write operation on Port-A and a read operation on Port-B. Read-write address and read data phases are indicated at the top of the diagram. The Port-A signals shown are substantially the same as those of FIG. 3. However, the Port-B signals in this case include a signal which corresponds to the Port-B read data output QB, and the SPRAM port signals include a signal which corresponds to its read data output Q. The Port-B read data is also denoted PB_Rd_Data in the diagram. The Port-A write data is written into the SPRAM on a rising edge of the clk_2X clock signal as indicated. The Port-B read data from the SPRAM is latched in flip-flop 226 on that same rising edge of the clk_2X clock signal. Also, the Port-B driver 106B samples the Port-B read data on a rising edge of the clk_1x clock signal as indicated.

Figure 5:
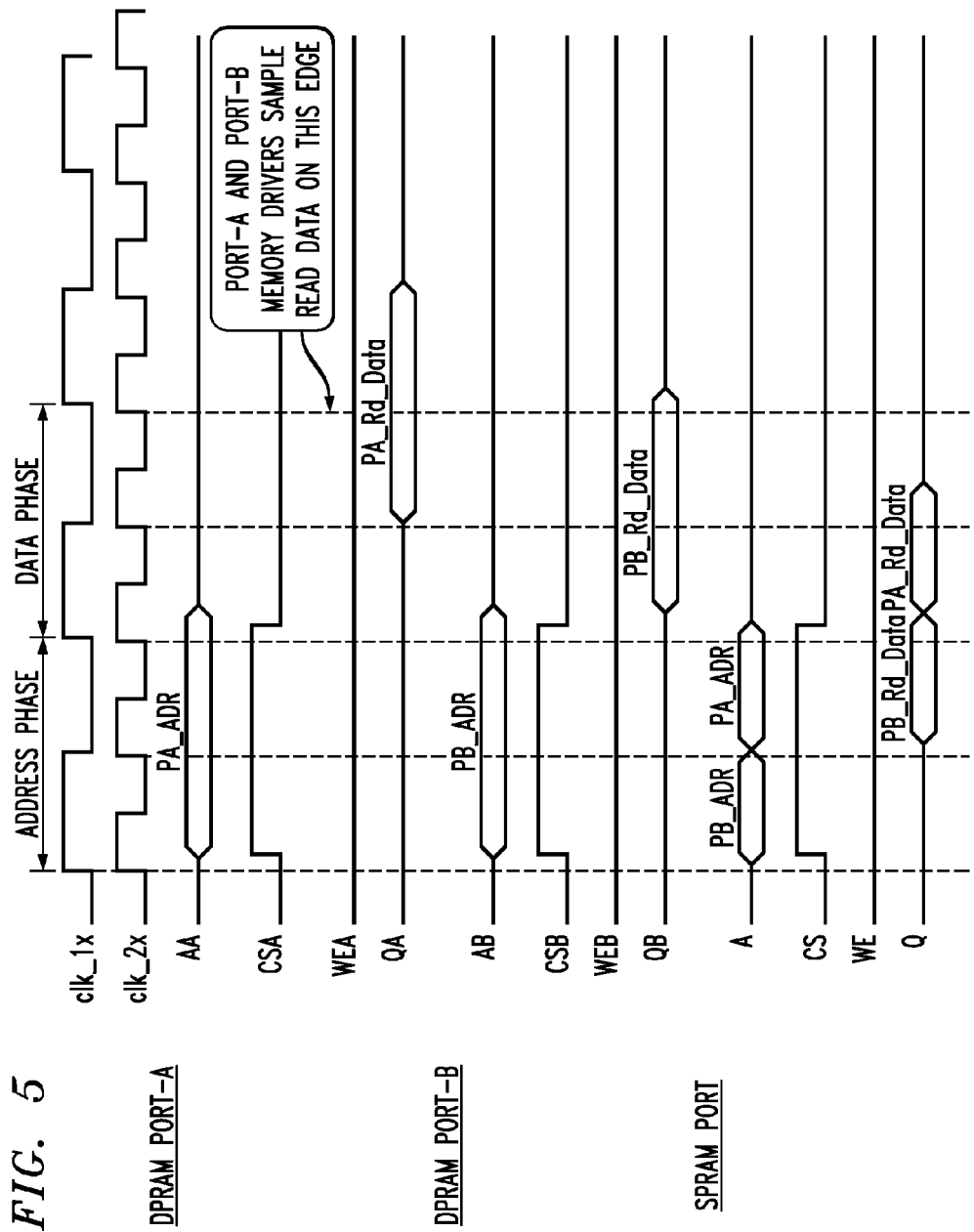
FIG. 5 is a timing diagram illustrating read operations on both ports of the dual-port memory device of FIG. 1.

The FIG. 5 timing diagram illustrates the case of read operations on both Port-A and Port-B. In this case, the Port-A signals include a signal which corresponds to the Port-A read data output QA. The Port-A read data is also denoted PA_Rd_Data in the diagram. As in the FIG. 4 timing diagram, address and read data phases are indicated at the top of the diagram of FIG. 5. The Port-A and Port-B read data at the output of SPRAM 112 are delivered by multiplexers 220 and 222 into respective ones of the flip-flops 224 and 226, where the data is latched. The Port-A and Port-B drivers 106A and 106B sample the respective QA and QB outputs on a rising edge of the clk_1x clock as indicated.

The operation of circuitry 220, 222, 224 and 226 in FIG. 2 as illustrated in the timing diagram of FIG. 5 may be viewed as an example of the demultiplexing of output read data time slots of the Q output of the single port of SPRAM 112 into respective read data output signals QA and QB that are supplied over the first and second ports Port-A and Port-B of the DPRAM 102. In this embodiment, the time slot demultiplexing is implemented using multiplexers, latch circuits and associated feedback connections. Other types of circuitry can be used to demultiplex output time slots of a single-port memory device in other embodiments.

The dual-port memory device 100 as described in conjunction with FIGS. 2 through 5 above provides a number of advantages relative to conventional arrangements. As indicated previously, this device exhibits reduced circuit area and power requirements relative to a conventional DPRAM device implemented using 8T memory cells. Accordingly, the overall size, cost and complexity of the device is reduced. The disclosed techniques provide a generic solution suitable for use with any type and dimension of memory array and a given design can be readily generated in RTL code using a script or other software.

Although illustrated using a dual-port memory device, the disclosed techniques can be adapted in a straightforward manner to support other multiple-port devices, such as a three-port memory device.

A given memory device configured in accordance with the present invention may be implemented as a stand-alone memory device, for example, as a packaged integrated circuit memory device suitable for incorporation into a higher-level circuit board or other system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory implemented within a microprocessor, digital signal processor (DSP), application-specific integrated circuit (ASIC), field-programmable gate array (FPGA) or other type of processor or integrated circuit device. Embodiments of the invention can therefore be implemented in a wide variety of different memory applications.

Figure 6:
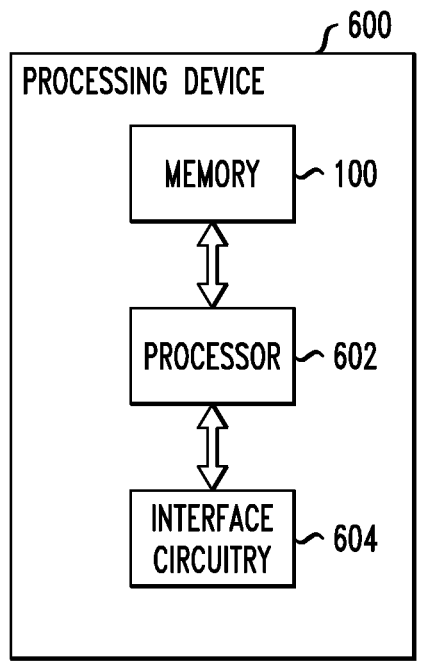
FIG. 6 is a block diagram of a processing device which incorporates the memory device of FIG. 1.

FIG. 6 shows an example of a processing device 600 which incorporates the memory device 100 of FIG. 1. In this embodiment, the memory device 100 is coupled to a processor 602. The processing device further includes interface circuitry 604 coupled to the processor 602. The processing device 600 may comprise, for example, a computer, a server or a portable communication device such as a mobile telephone. The interface circuitry 604 may comprise one or more transceivers for allowing the device 600 to communicate over a network.

Figure 7:
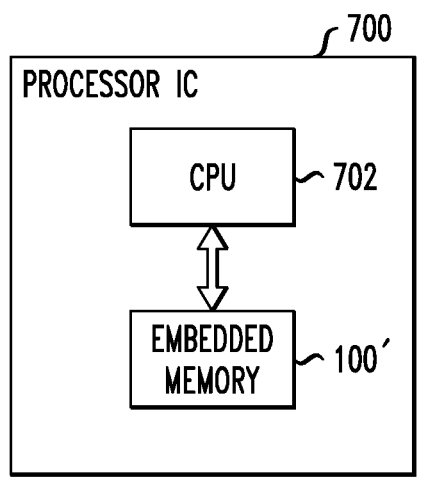
FIG. 7 is a block diagram of a processor integrated circuit which incorporates the memory device of FIG. 1 as an embedded memory.

Alternatively, processing device 600 may comprise a microprocessor, DSP or ASIC, with processor 602 corresponding to a central processing unit (CPU) and memory device 100 providing at least a portion of an embedded memory of the microprocessor, DSP or ASIC. FIG. 7 shows an example of an arrangement of this type, with processor integrated circuit 700 incorporating the memory device of FIG. 1 as an embedded memory 100'. The embedded memory 100' in this embodiment is coupled to a CPU 702.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of memory cells, memory arrays, single-port memory devices, supporting control circuitry and associated control signals, and other elements for implementing the described functionality. These and numerous other alternative embodiments within the scope of the following claims will be apparent to those skilled in the art.

What is claimed is:

1. A multiple-port memory device having at least first and second ports each configured to support read and write operations, the multiple-port memory device further comprising:
 a single-port memory device comprising a memory array; and
 control circuitry coupled between the first and second ports and the single-port memory device;
 wherein the control circuitry is configured to multiplex input signals received over the first and second ports of the multiple-port memory device into respective input time slots of the single port of the single-port memory device, and to demultiplex output time slots of the single port of the single-port memory device into respective output signals that are supplied over the first and second ports of the multiple-port memory device;
 wherein the single-port memory device receives the input signals in accordance with a first clock signal and processes those input signals using a second clock signal having a higher clock rate than the first clock signal; and
 wherein the input and output time slots are defined with respect to the second clock signal.

2. The multiple-port memory device of claim 1 wherein the single-port memory device operates at a clock rate that is an integer multiple of a clock rate of first and second memory drivers that supply the input signals to the respective first and second ports and receive the output signals from the respective first and second ports.

3. A multiple-port memory device having at least first and second ports each configured to support read and write operations, the multiple-port memory device further comprising:
 a single-port memory device comprising a memory array; and
 control circuitry coupled between the first and second ports and the single-port memory device;
 wherein the control circuitry is configured to multiplex input signals received over the first and second ports of the multiple-port memo device into respective input time slots of the single port of the single-port memory device, and to demultiplex output time slots of the single port of the single-port memory device into respective output signals that are supplied over the first and second ports of the multiple-port memory device;
 wherein the single-port memory device operates at a clock rate that is an integer multiple of a clock rate of first and second memory drivers that supply the input signals to the respective first and second ports and receive the output signals from the respective first and second ports; and
 wherein the multiple-port memory device comprises a dual-port memory device and the single-port memory device operates at a clock rate that is twice the clock rate of the first and second memory drivers.

4. The multiple-port memory device of claim 1 wherein the memory array comprises an SRAM array having a plurality of 6T memory cells.

5. The multiple-port memory device of claim 1 wherein the control circuitry comprises an input multiplexer having a first input coupled to an input portion of the first port of the multiple-port memory device and a second input coupled to an input portion of the second port of the multiple-port memory device.

6. The multiple-port memory device of claim 5 wherein the input multiplexer is configured to multiplex first and second input address signals from the respective first and second ports of the multiple-port memory device into respective address time slots of an address input of the single port of the single-port memory device.

7. The multiple-port memory device of claim 5 wherein the input multiplexer is configured to multiplex first and second input write data signals from the respective first and second ports of the multiple-port memory device into respective write data time slots of a write data input of the single port of the single-port memory device.

8. The multiple-port memory device of claim 5 wherein the input multiplexer is configured to multiplex first and second input chip select signals from the respective first and second ports of the multiple-port memory device into respective chip select time slots of a chip select input of the single port of the single-port memory device.

9. The multiple-port memory device of claim 5 wherein the input multiplexer is configured to multiplex first and second input write enable signals from the respective first and second ports of the multiple-port memory device into respective write enable time slots of a write enable input of the single port of the single-port memory device.

10. The multiple-port memory device of claim 5 further comprising port select circuitry configured to generate a select signal to control a state of at least the input multiplexer, wherein the port select circuitry generates the select signal by dividing a clock signal that is also applied to a clock signal input of the single-port memory device.

11. A multiple-port memory device having at least first and second ports each configured to support read and write operations, the multiple-port memory device further comprising:
 a single-port memory device comprising a memory array; and
 control circuitry coupled between the first and second ports and the single-port memory device;

wherein the control circuitry is configured to multiplex input signals received over the first and second ports of the multiple-port memory device into respective input time slots of the single port of the single-port memory device, and to demultiplex output time slots of the single port of the single-port memory device into respective output signals that are supplied over the first and second ports of the multiple-port memory device; and wherein the control circuitry comprises first and second output multiplexers and respective first and second latch circuits, each of the first and second output multiplexers having a first input coupled to an output portion of the single port of the single-port memory device and an output coupled via a corresponding one of the first and second latch circuits to an output portion of one of the first and second ports of the multiple-port memory device, an output of each latch circuit being fed back to a second input of the corresponding first or second output multiplexer.

12. The multiple-port memory device of claim 11 wherein the output multiplexers and associated latch circuits are configured to demultiplex read data time slots of a read data output of the single port of the single-port memory device into first and second output read data signals of the respective first and second ports of the multiple-port memory device.

13. An integrated circuit comprising the multiple-port memory device of claim 1.

14. A processing device comprising the multiple-port memory device of claim 1.

15. A method comprising:
multiplexing input signals received over at least first and second ports of a multiple-port memory device into respective input time slots of a single port of a single-port memory device; and
demultiplexing output time slots of the single port of the single-port memory device into output signals that are supplied over the first and second ports of the multiple-port memory device;

wherein the single-port memory device receives the input signals in accordance with a first clock signal and processes those input signals using a second clock signal having a higher clock rate than the first clock signal; and wherein the input and output time slots are defined with respect to the second clock signal.

16. The method of claim 15 further including operating the single-port memory device at a clock rate that is an integer multiple of a clock rate of first and second memory drivers that supply the input signals to the respective first and second ports and receive the output signals from the respective first and second ports.

17. A method comprising:
multiplexing input signals received over at least first and second ports of a multiple-port memory device into respective input time slots of a single port of a single-port memory device;
demultiplexing output time slots of the single port of the single-port memory device into output signals that are supplied over the first and second ports of the multiple-port memory device; and
operating the single-port memory device at a clock rate that is an integer multiple of a clock rate of first and second memory that supply u 1 the input signals to the respective first and second ports and receive the output signals from the respective first and second ports;
wherein the multiple-port memory device comprises a dual-port memory device and the single-port memory device operates at a clock rate that is twice the clock rate of the first and second memory drivers.

* * * * *

UNITED STATES PATENT AND TRADEMARK OFFICE
CERTIFICATE OF CORRECTION

PATENT NO. : 8,514,652 B2  Page 1 of 2
APPLICATION NO. : 13/038662
DATED : August 20, 2013
INVENTOR(S) : Nukaraju et al.

It is certified that error appears in the above-identified patent and that said Letters Patent is hereby corrected as shown below:

In the specifications:

Col. 3, line 18, please delete "clk_2X" and replace with --clk_2x--

Col. 3, line 19, please delete "clk_1x" and replace with --clk_1x--

Col. 3, line 21, please delete "1x" and replace with --1X--

Col. 3, line 47, please delete "clk_2X clock signal. The clk_2X" and replace with --clk_2x clock signal. The clk_2x--

Col. 3, line 54, please delete "clk_2X" and replace with --clk_2x--

Col. 5, line 64, please delete "clk_2X" and replace with --clk_2x--

Col. 6, line 1, please delete "clk_2X" and replace with --clk_2x--

Col. 6, line 12, please delete "clk_2X" and replace with --clk_2x--

Col. 6, line 13, please delete "clk_2X" and replace with --clk_2x--

Col. 7, line 31, please delete "clk_2X" and replace with --clk_2x--

Col. 7, line 34, please delete "clk_2X at the input side and from clk_2X" and replace with --clk_2x at the input side and from clk_2x--

Col. 7, line 36, please delete "clk_2X" and replace with --clk_2x--

Col. 7, line 55, please delete "clk_2X" and replace with --clk_2x--

Signed and Sealed this
Eleventh Day of February, 2014

Michelle K. Lee
*Deputy Director of the United States Patent and Trademark Office*

CERTIFICATE OF CORRECTION (continued)
U.S. Pat. No. 8,514,652 B2

Col. 8, line 5, please delete "clk_2X" and replace with --clk_2x--

Col. 8, line 7, please delete "clk_2X" and replace with --clk_2x--

In the claims:

Claim 3, col. 10, line 5, please delete "memo" and replace with --memory--

Claim 17, col. 12, line 27, please delete "memory that supply u 1" and replace with --memory drivers that supply--